United States Patent
Sakurai

(10) Patent No.: US 11,495,431 B2
(45) Date of Patent: Nov. 8, 2022

(54) TRANSMISSION ELECTRON MICROSCOPE AND ADJUSTMENT METHOD OF OBJECTIVE APERTURE

(71) Applicant: JEOL Ltd., Tokyo (JP)

(72) Inventor: Hitoshi Sakurai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/375,184

(22) Filed: Jul. 14, 2021

(65) Prior Publication Data

US 2022/0020560 A1 Jan. 20, 2022

(30) Foreign Application Priority Data

Jul. 15, 2020 (JP) .............................. JP2020-121321

(51) Int. Cl.
*H01J 37/26* (2006.01)
*H01J 37/10* (2006.01)
*H01J 37/20* (2006.01)

(52) U.S. Cl.
CPC ............ *H01J 37/265* (2013.01); *H01J 37/10* (2013.01); *H01J 37/20* (2013.01); *H01J 2237/0451* (2013.01)

(58) Field of Classification Search
CPC .......... H01J 37/00; H01J 37/02; H01J 37/265; H01J 37/10; H01J 37/20; H01J 37/295; H01J 37/09; H01J 2237/0451; H01J 2237/0453; H01J 2237/0458
USPC ......................................... 250/306, 307, 311
See application file for complete search history.

(56) References Cited

U.S. PATENT DOCUMENTS

| 6,323,485 | B1* | 11/2001 | Tsuno | ..................... | H01J 37/26 250/311 |
| 6,570,156 | B1* | 5/2003 | Tsuneta | ................... | H01J 37/28 977/869 |
| 2015/0170873 | A1* | 6/2015 | Miyazaki | ................ | H01J 37/20 250/442.11 |

FOREIGN PATENT DOCUMENTS

| JP | H0218844 A | 1/1990 |
| JP | H04139898 A | 5/1992 |
| JP | 2005310699 A | 11/2005 |
| JP | 2006216834 A | 8/2006 |

OTHER PUBLICATIONS

Office Action issued in JP2020121321 dated May 31, 2022.

\* cited by examiner

*Primary Examiner* — Jason L McCormack
(74) *Attorney, Agent, or Firm* — The Webb Law Firm

(57) ABSTRACT

A transmission electron microscope includes a control unit for: acquiring an image of an objective aperture; obtaining a position of the objective aperture; obtaining an amount of deviation between an object position and the position of the objective aperture, based on the position of the objective aperture; and operating an aperture moving mechanism, based on the amount of deviation of the position of the objective aperture. The position of the objective aperture is obtained by: binarizing the image of the objective aperture by using a set threshold; obtaining an area of an aperture hole of the objective aperture from the binarized image; determining whether the area is within a predetermined range; changing the threshold when a determination is made that the area is outside the predetermined range; and obtaining a position of the objective aperture when a determination is made that the area is within the predetermined range.

6 Claims, 6 Drawing Sheets

TRANSMISSION ELECTRON MICROSCOPE AND ADJUSTMENT METHOD OF OBJECTIVE APERTURE

CROSS-REFERENCE TO RELATED APPLICATION

This application claims priority to Japanese Patent Application No. 2020-121321 filed Jul. 15, 2020, the disclosure of which is hereby incorporated by reference in its entirety.

BACKGROUND OF THE INVENTION

Field of the Invention

The present invention relates to a transmission electron microscope and to an adjustment method of an objective aperture.

Description of Related Art

With a transmission electron microscope, by irradiating a specimen with an electron beam and forming an image with electrons having transmitted through the specimen, a transmission electron microscope image and an electron diffraction pattern can be acquired.

With a transmission electron microscope, a specimen is observed by inserting an objective aperture into a back focal plane of an objective lens. For example, with a transmission electron microscope, a bright-field image can be obtained by selecting, with use of the objective aperture, a transmitted wave in an electron diffraction pattern formed on the back focal plane of the objective lens. In addition, with a transmission electron microscope, a dark-field image can be obtained by selecting, with use of the objective aperture, any diffracted wave in the electron diffraction pattern.

For example, JP-A-2-18844 discloses, as an adjustment method of an objective aperture, a method of detecting a state of diffusion of an electron beam when excitation of a lens is periodically varied, and adjusting the objective aperture so that the state of diffusion of the electron beam is uniform around an optical axis. An aperture apparatus according to JP-A-2-18844 uses this method to automatically align a position of the aperture with the optical axis.

As described above, with a transmission electron microscope, an objective aperture is desirably accurately arranged at a desired position during observation.

SUMMARY OF THE INVENTION

According to a first aspect of the invention, there is provided a transmission electron microscope including:
an objective lens;
an objective aperture arranged on a back focal plane of the objective lens;
an aperture moving mechanism that moves the objective aperture; and
a control unit that controls the aperture moving mechanism,
the control unit performing processing for:
acquiring an image of the objective aperture;
obtaining a position of the objective aperture, based on the image of the objective aperture;
obtaining an amount of deviation between an object position and the position of the objective aperture, based on the position of the objective aperture; and
operating the aperture moving mechanism, based on the amount of deviation, and the processing for obtaining a position of the objective aperture performing processing for:
binarizing the image of the objective aperture by using a set threshold to acquire a binarized image;
obtaining an area of an aperture hole of the objective aperture from the binarized image;
determining whether or not the area is within a predetermined range;
changing the threshold when a determination is made that the area is not within the predetermined range; and
obtaining a position of the objective aperture, based on the binarized image when a determination is made that the area is within the predetermined range.

According to a second aspect of the invention, there is provided an adjustment method of an objective aperture in a transmission electron microscope, the method including:
acquiring an image of the objective aperture;
obtaining a position of the objective aperture, based on the image of the objective aperture;
obtaining an amount of deviation between an object position and the position of the objective aperture, based on the position of the objective aperture; and
operating an aperture moving mechanism, based on the amount of deviation,
the step of obtaining a position of the objective aperture including:
binarizing the image of the objective aperture by using a set threshold to acquire a binarized image;
obtaining an area of an aperture hole of the objective aperture from the binarized image;
determining whether or not the area is within a predetermined range;
changing the threshold when a determination is made that the area is not within the predetermined range; and
obtaining a position of the objective aperture, based on the binarized image when a determination is made that the area is within the predetermined range.

DESCRIPTION OF THE INVENTION

Figure 1:
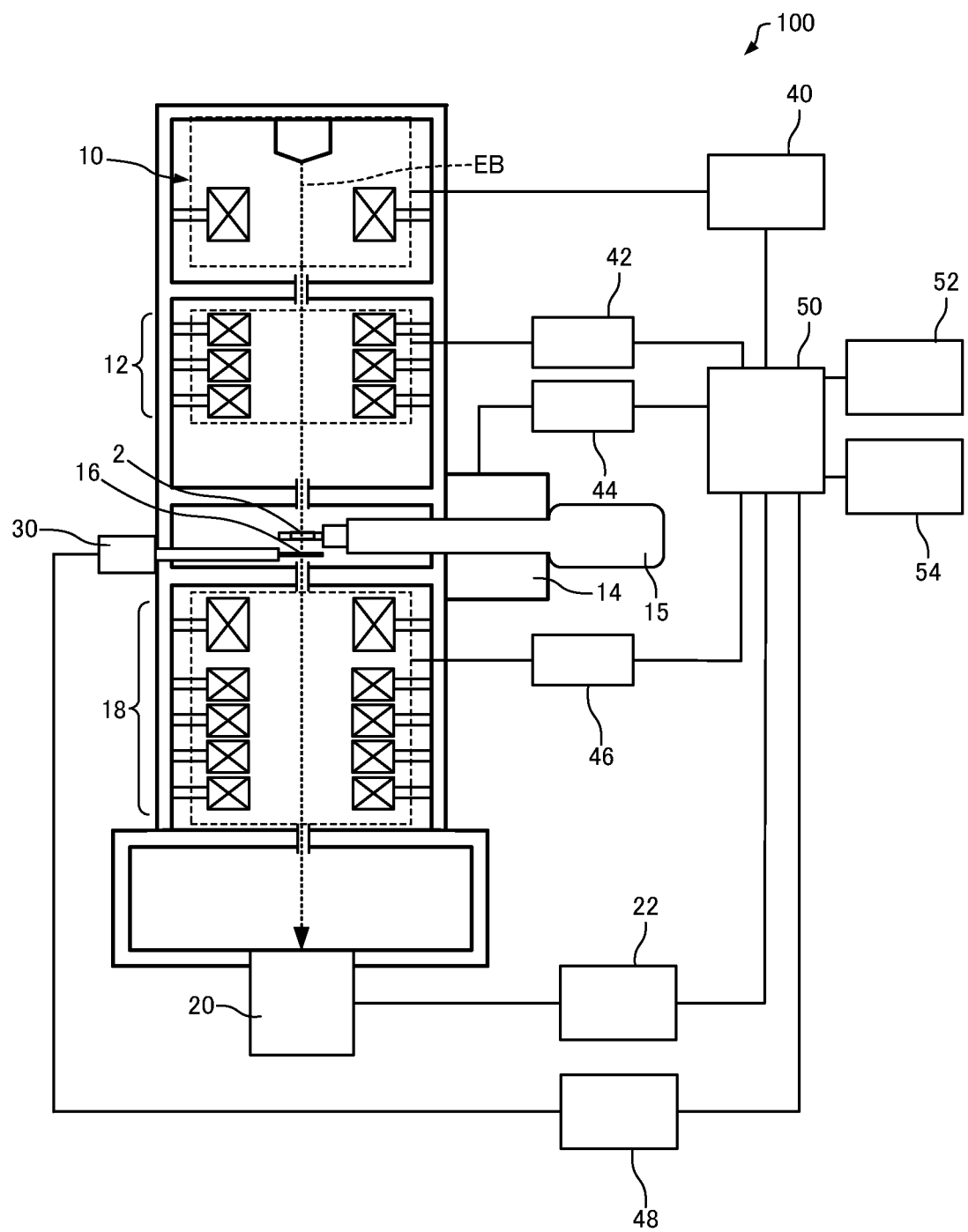
FIG. 1 is a diagram illustrating a configuration of a transmission electron microscope according to an embodiment of the invention.

According to an embodiment of the invention, there is provided a transmission electron microscope including:
an objective lens;

an objective aperture arranged on a back focal plane of the objective lens;

an aperture moving mechanism that moves the objective aperture; and a control unit that controls the aperture moving mechanism, the control unit performing processing for:

acquiring an image of the objective aperture;

obtaining a position of the objective aperture, based on the image of the objective aperture;

obtaining an amount of deviation between an object position and the position of the objective aperture, based on the position of the objective aperture; and operating the aperture moving mechanism, based on the amount of deviation, and the processing for obtaining a position of the objective aperture performing processing for:

binarizing the image of the objective aperture by using a set threshold to acquire a binarized image;

obtaining an area of an aperture hole of the objective aperture from the binarized image;

determining whether or not the area is within a predetermined range;

changing the threshold when a determination is made that the area is not within the predetermined range; and obtaining a position of the objective aperture, based on the binarized image when a determination is made that the area is within the predetermined range.

With the transmission electron microscope described above, an objective aperture can be automatically accurately arranged at a desired position.

According to an embodiment of the invention, there is provided an adjustment method of an objective aperture in a transmission electron microscope, the method including:

acquiring an image of the objective aperture;

obtaining a position of the objective aperture, based on the image of the objective aperture;

obtaining an amount of deviation between an object position and the position of the objective aperture, based on the position of the objective aperture; and operating an aperture moving mechanism, based on the amount of deviation, the step of obtaining a position of the objective aperture including:

binarizing the image of the objective aperture by using a set threshold to acquire a binarized image;

obtaining an area of an aperture hole of the objective aperture from the binarized image;

determining whether or not the area is within a predetermined range;

changing the threshold when a determination is made that the area is not within the predetermined range; and obtaining a position of the objective aperture, based on the binarized image when a determination is made that the area is within the predetermined range.

With the adjustment method of an objective aperture described above, an objective aperture can be accurately arranged at a desired position.

Hereinafter, preferred embodiments of the invention are described in detail with reference to the drawings. It is noted that the following embodiments do not unduly limit the scope of the invention as set forth in the claims. In addition, all of the components described below are not necessarily essential requirements of the invention.

1. Transmission Electron Microscope

First, a transmission electron microscope according to an embodiment of the invention will be described with reference to the drawings. FIG. 1 is a diagram illustrating a configuration of a transmission electron microscope 100 according to the present embodiment.

With the transmission electron microscope 100, by irradiating a specimen 2 with an electron beam EB and forming an image with electrons having been transmitted through the specimen 2, a transmission electron microscope image (TEM image) and an electron diffraction pattern can be acquired.

As illustrated in FIG. 1, the transmission electron microscope 100 includes an electron gun 10, an illumination lens system 12, a specimen stage 14, a specimen holder 15, an objective aperture 16, an imaging lens system 18, an imaging device 20, an imaging control apparatus 22, an aperture moving mechanism 30, an electron gun control apparatus 40, an illumination lens system control apparatus 42, a specimen stage control apparatus 44, an imaging lens system control apparatus 46, a moving mechanism control apparatus 48, a control unit 50, a display unit 52, and a storage unit 54.

The electron gun 10 emits an electron beam EB. For example, the electron gun 10 accelerates electrons emitted from a cathode by an anode and emits the electron beam EB.

The illumination lens system 12 causes the electron beam EB emitted from the electron gun 10 to converge and irradiates the specimen 2 with the converged electron beam EB. The illumination lens system 12 is constituted by a plurality of (in the illustrated example, three) condenser lenses.

The specimen stage 14 holds the specimen 2 via the specimen holder 15. The specimen 2 can be positioned by using the specimen stage 14. In the illustrated example, the specimen stage 14 is a specimen stage that adopts a side entry system into which the specimen holder 15 is inserted from a horizontal direction (the side) with respect to a pole piece of the objective lens. Alternatively, the specimen stage 14 may be a specimen stage that adopts a top entry system into which the specimen 2 is inserted from above the pole piece of the objective lens. The specimen stage 14 has a specimen moving mechanism which moves the specimen 2 in a horizontal direction and a vertical direction. In addition, the specimen stage 14 and the specimen holder 15 have a specimen tilting mechanism that tilts the specimen 2.

The objective aperture 16 is arranged on a back focal plane of the objective lens. The objective aperture 16 selects an electron beam for imaging from the electron beam EB having been transmitted through the specimen 2. For example, a bright-field image can be obtained by selecting, using the objective aperture 16, a transmitted wave in an electron diffraction pattern formed on the back focal plane of the objective lens. In addition, for example, a dark-field image can be obtained by selecting, using the objective aperture 16, a diffracted wave in the electron diffraction pattern formed on the back focal plane of the objective lens. The objective aperture 16 has a plurality of aperture holes. The plurality of aperture holes have aperture diameters that differ from each other. A shape of the aperture holes of the objective aperture 16 is a circle when viewed from a direction parallel to an optical axis.

The imaging lens system 18 forms a TEM image and an electron diffraction pattern with the electron beam EB having been transmitted through the specimen 2. For example, the imaging lens system 18 includes an objective lens, an intermediate lens, and a projector lens.

For example, a TEM image can be photographed by focusing the intermediate lens on a transmission electron microscope image (a specimen image) that is formed by the objective lens. In addition, for example, an electron diffraction pattern can be photographed by focusing the intermediate lens on an electron diffraction pattern that is formed by the objective lens.

The imaging device 20 photographs images (a TEM image and an electron diffraction pattern) having been formed by the imaging lens system 18. For example, the imaging device 20 is a digital camera such as a CCD (Charge Coupled Device) camera. Image data of an image photographed by the imaging device 20 is output to the control unit 50 via the imaging control apparatus 22. An image photographed by the imaging device 20 is stored in the storage unit 54 as an image file and displayed on the display unit 52.

The aperture moving mechanism 30 positions the objective aperture 16. The aperture moving mechanism 30 moves the objective aperture 16 in the horizontal direction. For example, the aperture moving mechanism 30 moves the objective aperture 16 by operating a motor. An aperture diameter can also be changed by moving the objective aperture 16 using the aperture moving mechanism 30.

The electron gun control apparatus 40 controls the electron gun 10. The electron gun control apparatus 40 operates the electron gun 10 based on, for example, a control signal output from the control unit 50. The illumination lens system control apparatus 42 controls the illumination lens system 12. The illumination lens system control apparatus 42 operates the illumination lens system 12 based on, for example, a control signal output from the control unit 50.

The specimen stage control apparatus 44 controls the specimen stage 14. The specimen stage control apparatus 44 operates the specimen stage 14 based on, for example, a control signal output from the control unit 50. The imaging lens system control apparatus 46 controls the imaging lens system 18. The imaging lens system control apparatus 46 controls the imaging lens system 18 based on, for example, a control signal output from the control unit 50. The moving mechanism control apparatus 48 controls the aperture moving mechanism 30. The moving mechanism control apparatus 48 operates the aperture moving mechanism 30 based on, for example, a control signal output from the control unit 50.

The control unit 50 controls each unit that constitutes the transmission electron microscope 100. Functions of the control unit 50 can be realized by, for example, having various processors (a CPU (Central Processing Unit), a DSP (digital signal processor), and the like) execute programs stored in the storage unit 54. It should be noted that at least a part of the functions of the control unit 50 may be realized by a dedicated circuit such as an ASIC (a gate array or the like).

The display unit 52 displays an image generated by the control unit 50 and a function thereof can be realized by an LCD (liquid crystal display) or the like. For example, an image photographed by the imaging device 20 is displayed on the display unit 52. In addition, for example, the display unit 52 displays a GUI (Graphical User Interface) for controlling the imaging control apparatus 22, the aperture moving mechanism 30, the electron gun control apparatus 40, the illumination lens system control apparatus 42, the specimen stage control apparatus 44, the imaging lens system control apparatus 46, and the moving mechanism control apparatus 48.

The storage unit 54 stores programs and various kinds of data which allow a computer to function as the control unit 50. In addition, the storage unit 54 also functions as a work area of the control unit 50. Functions of the storage unit 54 can be realized by a hard disk, a RAM (Random Access Memory), or the like.

2. Position Adjustment Method of Objective Aperture

Next, an adjustment method of the objective aperture 16 in the transmission electron microscope 100 will be described. Hereinafter, a case where a transmitted wave in an electron diffraction pattern is selected by the objective aperture 16 will be described. It is assumed that the transmitted wave is positioned at a center of a field of view or, in other words, at a center of an image photographed by the imaging device 20. In addition, in the following description, the position of the objective aperture 16 is assumed to be a position of a center of an aperture hole of the objective aperture 16.

Figure 2:
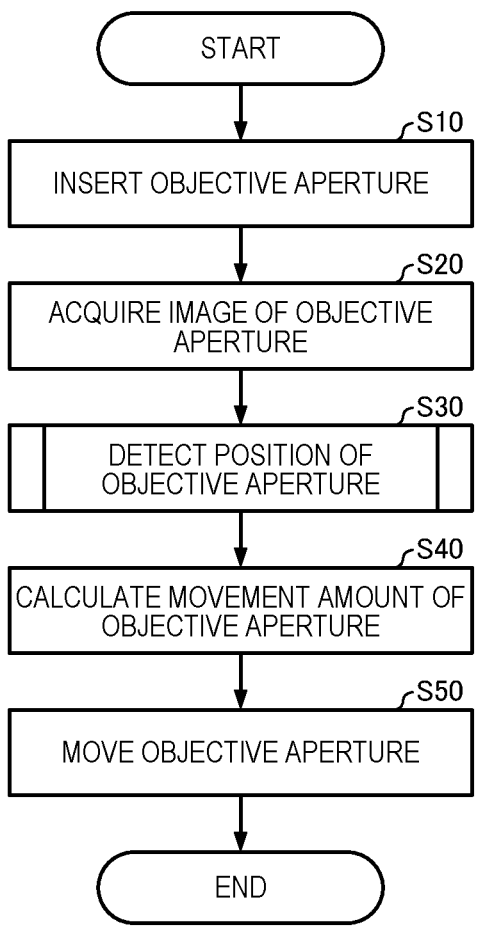
FIG. 2 is a flowchart illustrating an example of a position adjustment method of an objective aperture.

FIG. 2 is a flowchart illustrating an example of a position adjustment method of the objective aperture 16 in the transmission electron microscope 100.

First, in the transmission electron microscope 100, the imaging lens system 18 is placed in a state where an electron diffraction pattern can be observed. Then, the objective aperture 16 is inserted (S10). After inserting the objective aperture 16, the electron diffraction pattern is photographed by the imaging device 20 at an arbitrary camera length to acquire an image of the objective aperture 16 (S20).

Figure 3:
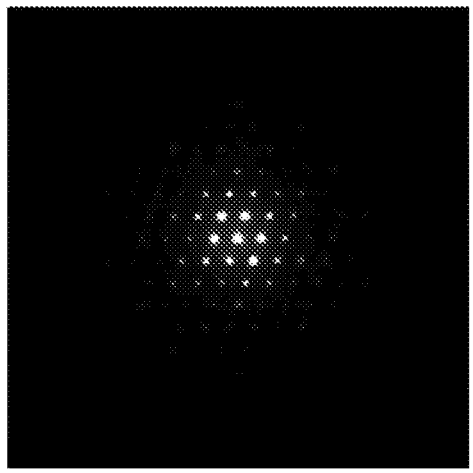
FIG. 3 is an image obtained by photographing an electron diffraction pattern in a state where an objective aperture is not inserted.
Figure 4:
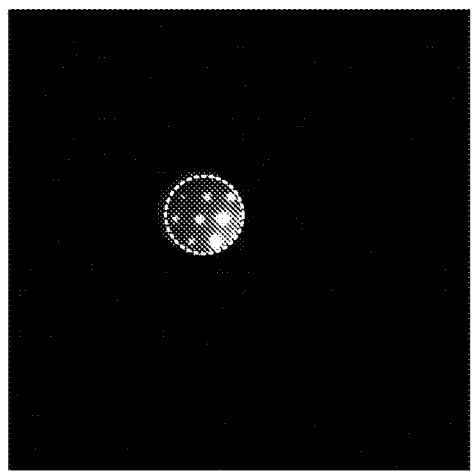
FIG. 4 is an image obtained by photographing an electron diffraction pattern in a state where an objective aperture is inserted.

FIG. 3 is an image obtained by photographing the electron diffraction pattern in a state where the objective aperture 16 is not inserted. FIG. 4 is an image obtained by photographing the electron diffraction pattern in a state where the objective aperture 16 is inserted. In FIG. 4, the objective aperture 16 is indicated by a dashed line.

By using the image of the objective aperture 16 including the electron diffraction pattern illustrated in FIG. 4, a position (x, y) of the objective aperture 16 on the image is detected (S30). A unit of the position (x, y) of the objective aperture 16 is, for example, a pixel. Details of step S30 for detecting the position of the objective aperture 16 will be provided later.

Next, a movement amount for moving the objective aperture 16 to a center position of the image is calculated (S40). For example, first, a difference between the position (x, y) of the objective aperture 16 and a center position (cx, cy) of the image or, in other words, an amount of deviation between the position (x, y) of the objective aperture 16 and the center position (cx, cy) of the image is obtained. Specifically, both an amount of deviation in an X direction and an amount of deviation in a Y direction between the position (x, y) of the objective aperture 16 and the center position (cx, cy) of the image are obtained. The amount of deviation in the X direction and the amount of deviation in the Y direction can also be expressed as a vector or, in other words, an amount of deviation and a direction of the deviation.

Next, based on the difference or, in other words, the amount of deviation between the position (x, y) of the objective aperture 16 and the center position (cx, cy) of the image, a movement amount for moving the objective aperture 16 to the center position of the image is calculated.

A movement amount mx in the X direction of the objective aperture 16 and a movement amount my in the Y direction of the objective aperture 16 can be obtained by mathematical expression (1) below.

$$\begin{pmatrix} mx \\ my \end{pmatrix} = \begin{pmatrix} a & b \\ c & d \end{pmatrix} \begin{pmatrix} x - cx \\ y - cy \end{pmatrix} \quad (1)$$

In mathematical expression (1), a, b, c, and d are coefficients for converting an amount of deviation of a position on an image into an amount of actual movement of the objective aperture 16. In addition, the X direction is an insertion direction of the objective aperture 16 and the Y direction is a direction perpendicular to the X direction.

The objective aperture 16 is moved by the aperture moving mechanism 30 by the movement amount mx in the X direction and the movement amount my in the Y direction of the objective aperture 16 calculated by mathematical expression (1) above (S50). Accordingly, the objective aperture 16 can be arranged at the center of the image.

Figure 5:
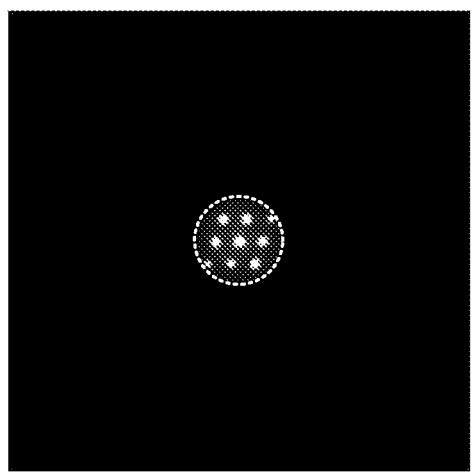
FIG. 5 illustrates a state where an objective aperture is positioned at center of an image.

FIG. 5 illustrates a state where the objective aperture 16 is positioned at the center of an image. In FIG. 5, the objective aperture 16 is indicated by a dashed line.

While a case where the objective aperture 16 is moved to the center of an image has been described above, alternatively, the objective aperture 16 can be moved to a desired position. In this case, using a desired position (dx, dy) in place of the center position (cx, cy) of the image enables the objective aperture 16 to be moved to the desired position.

Figure 6:
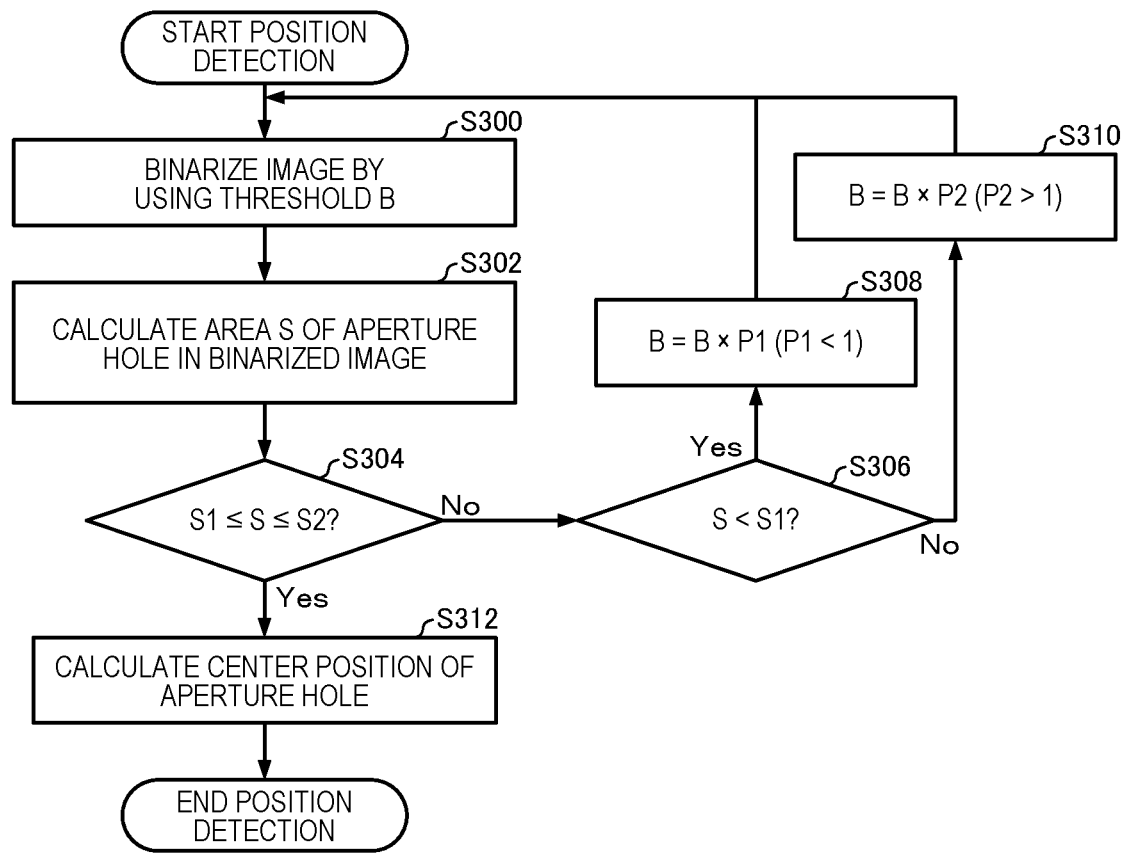
FIG. 6 is a flowchart illustrating an example of steps of detecting a position of an objective aperture.

Next, step S30 of detecting the position of the objective aperture 16 will be described. FIG. 6 is a flowchart illustrating an example of step S30 of detecting the position of the objective aperture 16.

First, the image of the objective aperture 16 illustrated in FIG. 4 is binarized by using a set threshold B (S300). In this case, in the image of the objective aperture 16, pixels of which a value of brightness is larger than the threshold B are converted into white and pixels of which a value of brightness is equal to or smaller than the threshold B are converted into black. Accordingly, a binarized image can be obtained.

Figure 7:
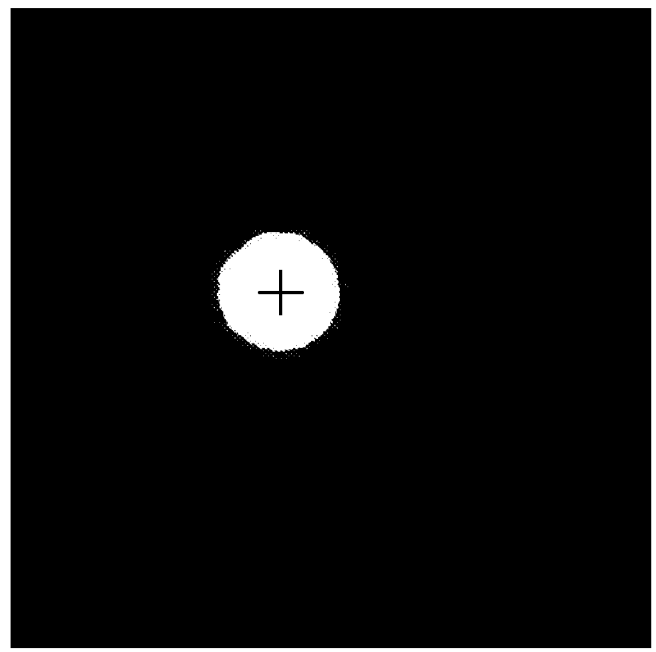
FIG. 7 illustrates a binarized image.

FIG. 7 illustrates a binarized image. A marker indicating a center position of a white region is illustrated in FIG. 7.

As illustrated in FIG. 7, by binarizing the image of the objective aperture 16, the position of the objective aperture 16 can be detected if a shape of an aperture hole of the objective aperture 16 can be extracted. For example, the position of the objective aperture 16 can be detected by calculating the center position of the white region from the binarized image.

However, when the threshold B is not appropriate, even if the center position of the white region in the binarized image is calculated, the center position of the white region ends up being deviated from a center of the aperture hole of the objective aperture 16.

Figure 8:
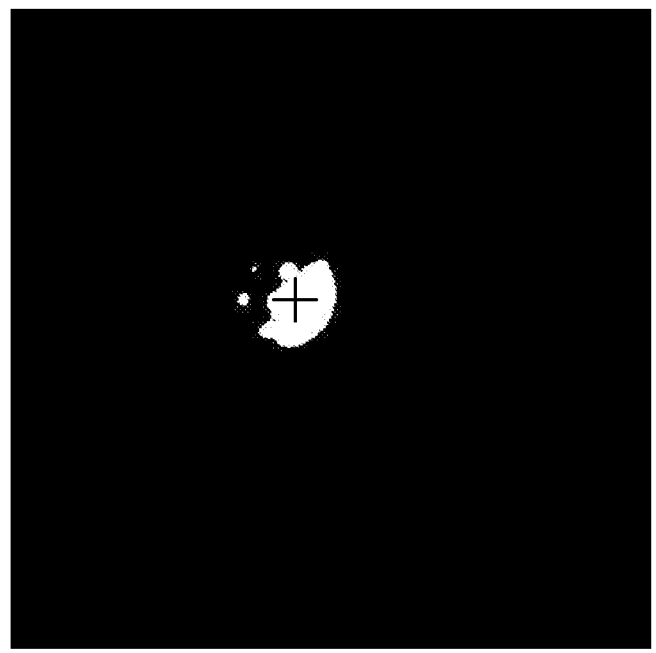
FIG. 8 illustrates a binarized image when a threshold is not appropriate.

FIG. 8 illustrates a binarized image when the threshold B is not appropriate. FIG. 8 illustrates a marker indicating a center position of a calculated white region.

Even if the center position of the white region is calculated from the binarized image illustrated in FIG. 8, the center position of the white region does not coincide with a position of the center of the aperture hole of the objective aperture 16. Therefore, in order to accurately detect the position of the objective aperture 16 in the binarized image, an optimal threshold B must be set.

After binarizing the image of the objective aperture 16 illustrated in FIG. 4 by using the threshold B set in advance (after S300), an area S of the white region in the obtained binarized image is calculated (S302). In other words, an area of the aperture hole in the binarized image is calculated.

Next, a determination is made as to whether or not the area S satisfies S1≤S≤S2 (S304). In this case, a lower limit value S1 and an upper limit value S2 of a range of the area S are parameters related to the area of the aperture hole of the objective aperture 16 at a camera length (magnification) when the objective aperture 16 is observed. For example, S1 and S2 are set such that S1=S0×0.9 and S2=S0×1.1. In this case, S0 denotes the area of the aperture hole at a camera length when the image of the objective aperture 16 is obtained. When S1≤S≤S2 is satisfied, a determination can be made that the aperture hole in the binarized image is accurately extracted.

It should be noted that the lower limit value S1 and the upper limit value S2 can be changed as appropriate in accordance with required positioning accuracy of the objective aperture 16.

When the area S does not satisfy S1≤S≤S2 (No in S304), a determination is made as to whether or not the area S satisfies S<S1 (S306). When S<S1 is satisfied (Yes in S306), the threshold B is changed to B=B×P1 (where P1<1) (S308). In other words, the threshold B is reduced when the area S is smaller than the lower limit value S1 of the set range.

On the other hand, when S<S1 is not satisfied (No in S306) or, in other words, when S>S2, the threshold B is changed to B=B×P2 (where P2>1) (S310). In other words, the threshold B is increased when the area S is larger than the upper limit value S2 of the set range. In this case, P1 and P2 are parameters for changing a value of the threshold B. For example, P1 and P2 are set such that P1=0.9 and P2=1.1. The value of the parameter P1 and the value of the parameter P2 can be changed as appropriate.

After processing (S306, S308, and S310) for changing the threshold B, a return is made to step S300 to binarize the image of the objective aperture 16 illustrated in FIG. 4 by using the changed threshold B (S300). Next, the area S is calculated in the obtained binarized image (S302) and a determination is made as to whether or not the area S satisfies S1≤S≤S2 (S304).

In this manner, processing of step S300, step S302, step S304, step S306, step S308, and step S310 is repeated until S1≤S≤S2 is satisfied.

When S1≤S≤S2 is satisfied (Yes in S304), in the binarized image, the position (x, y) of the objective aperture 16 on the binarized image is calculated (S312). Specifically, a center (a center of gravity) of the white region in the binarized image is calculated.

For example, in the binarized image, if i-th pixel coordinates are denoted by (xi, yi) and brightness at the i-th pixel coordinates is denoted by Bi, then the center of gravity of the white region can be calculated by mathematical expression (2) below.

$$\left( \frac{\sum_i (xi \cdot Bi)}{\sum_i xi}, \frac{\sum_i (yi \cdot Bi)}{\sum_i yi} \right) \quad (2)$$

In order to remove noise of the binarized image, the center of the white region may be obtained after performing filtering on the binarized image by using a median filter or the like.

In addition, a method of calculating the center of the white region is not limited to a method of obtaining a center of gravity of the white region as described above. For example, in the binarized image, the position of the objective aperture 16 may be detected by extracting a contour of an aperture hole of the objective aperture 16. As a method of extracting a contour of the white region, for example, a contour extraction function of Python can be used.

The position of the objective aperture 16 can be detected by the step described above.

3. Processing

In the transmission electron microscope 100, the position of the objective aperture 16 can be automatically adjusted by having the control unit 50 perform the adjustment method of the objective aperture 16 described above.

Figure 9:
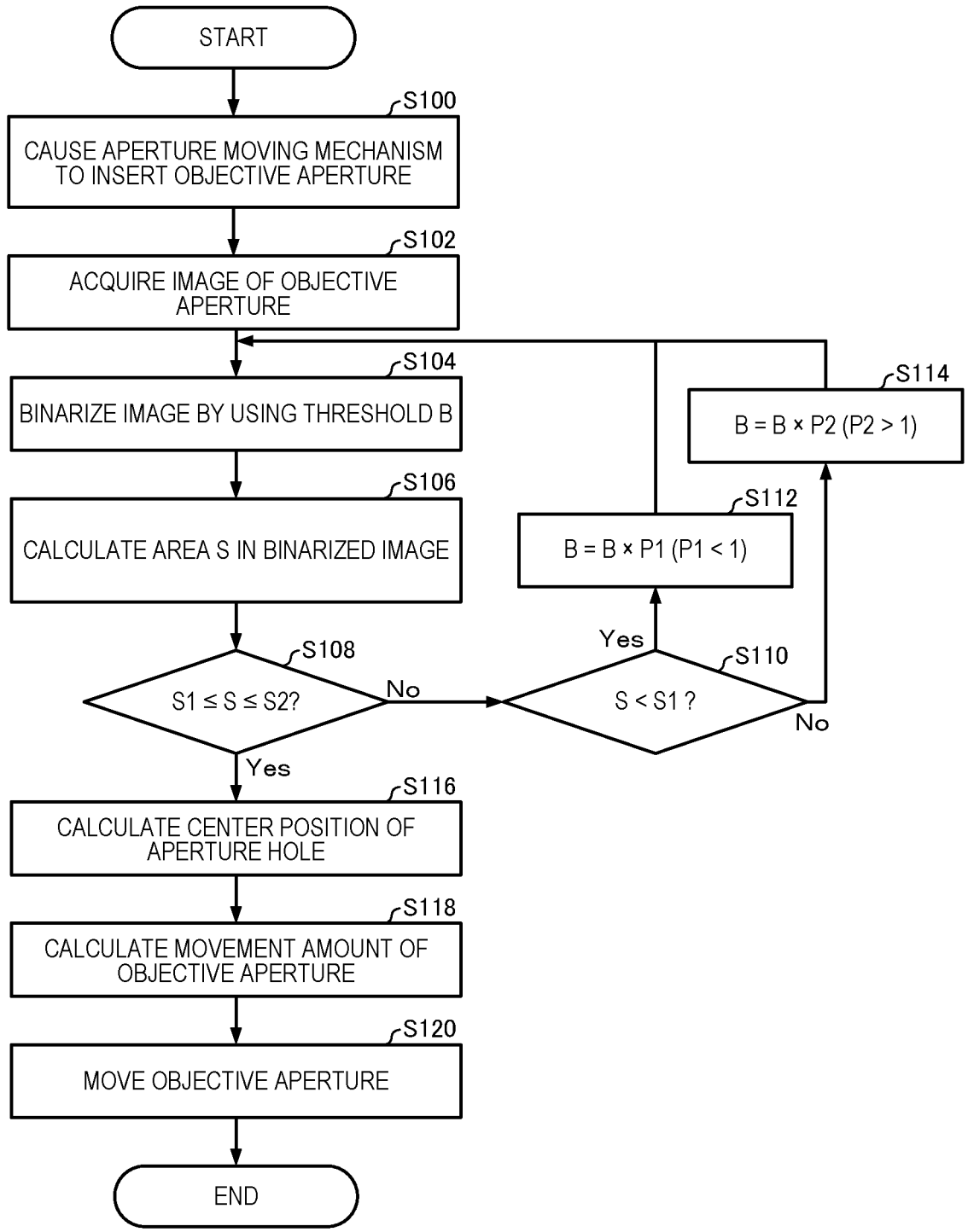
FIG. 9 is a flow chart illustrating an example of processing performed by a control unit.

FIG. 9 is a flow chart illustrating an example of processing performed by the control unit 50.

When a user performs an operation for inserting the objective aperture 16 by using an input apparatus (not illustrated), the control unit 50 receives an operation signal from the input apparatus and controls the moving mechanism control apparatus 48 so that the aperture moving mechanism 30 inserts the objective aperture 16 (S100).

When the objective aperture 16 has a plurality of aperture holes with different aperture diameters, the control unit 50 controls the moving mechanism control apparatus 48 so that an aperture hole with an aperture diameter having been designated by the user is arranged on an optical axis. Accordingly, an aperture hole with an aperture diameter having been designated by the user is arranged in a vicinity of the optical axis.

Next, the control unit 50 controls the imaging lens system control apparatus 46 so that the imaging lens system 18 is placed in a state where an electron diffraction pattern can be observed. In addition, the control unit 50 causes the imaging control apparatus 22 to photograph the objective aperture 16 with the imaging device 20. Accordingly, the control unit 50 acquires an image of the objective aperture 16 including the electron diffraction pattern (S102).

Next, the control unit 50 binarizes the acquired image of the objective aperture 16 by using the set threshold B and acquires a binarized image (S104).

Next, the control unit 50 calculates the area S of the white region from the binarized image (S106). In addition, the control unit 50 determines whether or not the area S is within a set range of the area S or, in other words, whether or not the area S satisfies S1≤S≤S2 (S108). The control unit 50 sets S1 and S2 such that S1=S0×0.9 and S2=S0×1.1.

In this case, an area SA of an aperture hole with a given aperture diameter D obtained when the aperture hole had been photographed at a camera length L is stored in the storage unit 54. The control unit 50 acquires information on an aperture diameter d and a camera length l of the objective aperture 16 currently being inserted and calculates an area S0 from the aperture diameter d and the camera length l by using the following mathematical expression.

$$S0 = SA \times (1/L)^2 \times (d/D)^2$$

By using the calculated area S0, the control unit 50 sets the lower limit value S1=S0×0.9 and the upper limit value S2=S0×1.1 of the area S.

When the area S does not satisfy S1≤S≤S2 (No in S108), the control unit 50 determines whether or not the area S satisfies S<S1 (S110). When the control unit 50 determines that S<S1 is satisfied (Yes in S110), the control unit 50 sets the threshold B to B=B×P1 (where P1<1) (S112). On the other hand, when the control unit 50 determines that S<S1 is not satisfied (No in S110), the control unit 50 sets the threshold B to B=B×P2 (where P2>1) (S114).

After processing (S112 and S114) for changing the threshold B, the control unit 50 returns to step S104 to binarize the image of the electron diffraction pattern by using the changed threshold B (S104), calculates the area S (S106), and determines whether or not the area S satisfies S1≤S≤S2 (S108). The control unit 50 repeats processing of step S104, step S106, step S108, step S110, step S112, and step S114 until S1≤S≤S2 is satisfied.

When the control unit 50 determines that S1≤S≤S2 is satisfied (Yes in S108), in the binarized image, the control unit 50 calculates the position (x, y) of the objective aperture 16 (S116). Specifically, the control unit 50 calculates a center (a center of gravity) of the white region in the binarized image by using mathematical expression (2) above.

Next, the control unit 50 calculates a movement amount for moving the objective aperture 16 to a center position (cx, cy) of the image (S118). For example, the control unit 50 calculates the movement amount mx in the X direction of the objective aperture 16 and the movement amount my in the Y direction of the objective aperture 16 by using mathematical expression (1) above.

The control unit 50 controls the moving mechanism control apparatus 48 so that the aperture moving mechanism 30 moves the objective aperture 16 by the calculated movement amount mx and the calculated movement amount my (S120). Accordingly, a center of an aperture hole of the objective aperture 16 can be made to coincide with the center of the image.

The position of the objective aperture 16 can be adjusted according to the processing described above.

4. Operational Advantage

In the transmission electron microscope 100, the control unit 50 performs: processing for acquiring an image of the objective aperture 16; processing for obtaining a position of the objective aperture 16 based on the image of the objective aperture 16; processing for obtaining an amount of deviation between an object position and the position of the objective aperture 16 based on the position of the objective aperture 16; and processing for operating the aperture moving mechanism 30 based on the amount of deviation. In addition, the processing for obtaining a position of the objective aperture 16 includes performing: processing for binarizing the image of the objective aperture 16 by using a set threshold B to acquire a binarized image; processing for obtaining an area S of an aperture hole of the objective aperture 16 from the binarized image; processing for determining whether or not the area S is within a predetermined range; processing for changing the threshold B when it is determined that the area S is not within the predetermined range; and processing for obtaining a position of the objective aperture 16 based on the binarized image when it is determined that the area S is within the predetermined range.

In this manner, with the transmission electron microscope 100, since the position of the objective aperture 16 can be accurately detected from a binarized image, the objective aperture 16 can be accurately arranged at a desired position. In addition, in the transmission electron microscope 100, since the control unit 50 performs the processing described above, the position of the objective aperture 16 can be automatically adjusted.

With the transmission electron microscope 100, in the processing for changing the threshold B, the threshold B is reduced when the area S is smaller than a lower limit value S1 of the predetermined range but the threshold B is increased when the area S is larger than an upper limit value S2 of the predetermined range. In addition, with the transmission electron microscope 100, after the processing for changing the threshold B, processing for acquiring a binarized image by using the changed threshold B is performed. Therefore, with the transmission electron microscope 100, the position of the objective aperture 16 can be accurately detected in the binarized image.

With the transmission electron microscope 100, the object position is a position of a transmitted wave of an electron diffraction pattern. Accordingly, with the transmission electron microscope 100, a bright-field image can be acquired.

An adjustment method of the objective aperture 16 in the transmission electron microscope 100 includes the steps of: acquiring an image of the objective aperture 16; obtaining a position of the objective aperture 16 based on the image of the objective aperture 16; obtaining an amount of deviation between an object position and the position of the objective aperture 16 based on the position of the objective aperture 16; and operating the aperture moving mechanism 30 based on the amount of deviation. In addition, the step of obtaining a position of the objective aperture 16 includes the steps of: binarizing the image of the objective aperture 16 by using a set threshold B to acquire a binarized image; obtaining an area S of an aperture hole of the objective aperture 16 from the binarized image; determining whether or not the area S is within a predetermined range; changing the threshold B when it is determined that the area S is not within the predetermined range; and obtaining a position of the objective aperture 16 based on the binarized image when it is determined that the area S is within the predetermined range.

Therefore, according to the adjustment method of the objective aperture 16 in the transmission electron microscope 100, the objective aperture 16 can be accurately arranged at a desired position.

The invention is not limited to the above-described embodiments, and various modifications can be made within the scope of the invention.

For example, while a case where a transmitted wave is selected by using the objective aperture 16 has been described above, alternatively, a diffracted wave may be selected by using the objective aperture 16. In this case, in the processing (S118) of calculating a movement amount of the objective aperture 16 illustrated in FIG. 9, a position (dx, dy) of the diffracted wave to be selected need only be used in place of the center position (cx, cy) of the image. In this manner, the control unit 50 is capable of arranging the objective aperture 16 at a desired position.

In addition, for example, based on the movement amount mx and the movement amount my having been calculated in the processing of step S118 illustrated in FIG. 9, the control unit 50 may calculate positional coordinates of the objective aperture 16 when a center of an aperture hole of the objective aperture 16 coincides with a center of the image and cause the storage unit 54 to store the positional coordinates. For example, by having the storage unit 54 store the positional coordinates for each aperture hole in advance, when using the objective aperture 16, the position of the objective aperture 16 can be adjusted in a short period of time.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A transmission electron microscope, comprising:
an objective lens;
an objective aperture arranged on a back focal plane of the objective lens;
an aperture moving mechanism that moves the objective aperture; and
a control unit that controls the aperture moving mechanism,
the control unit configured to perform processing for:
acquiring an image of the objective aperture;
obtaining a position of the objective aperture, based on the image of the objective aperture;
obtaining an amount of deviation between an object position and the position of the objective aperture, based on the position of the objective aperture; and
operating the aperture moving mechanism, based on the amount of deviation, and
the processing for obtaining the position of the objective aperture performing processing for:
binarizing the image of the objective aperture by using a set threshold to acquire a binarized image;
obtaining an area of an aperture hole of the objective aperture from the binarized image;
determining whether the area is within a predetermined range;
changing the threshold when a determination is made that the area is not within the predetermined range; and
obtaining the position of the objective aperture, based on the binarized image when a determination is made that the area is within the predetermined range.

2. The transmission electron microscope according to claim 1, wherein
in the processing for changing the threshold,
the threshold is reduced when the area is smaller than a lower limit value of the predetermined range, and
the threshold is increased when the area is larger than an upper limit value of the predetermined range.

3. The transmission electron microscope according to claim 1, wherein
after the processing for changing the threshold, the control unit is configured to perform processing for acquiring the binarized image by using the changed threshold.

4. The transmission electron microscope according to claim 1, wherein
in the processing for acquiring the image of the objective aperture, an electron diffraction pattern on the back focal plane of the objective lens is photographed in a state where the objective aperture has been inserted.

5. The transmission electron microscope according to claim 4, wherein
the object position is a position of a transmitted wave of the electron diffraction pattern.

6. An adjustment method of an objective aperture in a transmission electron microscope, the method comprising:
acquiring an image of the objective aperture;
obtaining a position of the objective aperture, based on the image of the objective aperture;

obtaining an amount of deviation between an object position and the position of the objective aperture, based on the position of the objective aperture; and operating an aperture moving mechanism, based on the amount of deviation, wherein the step of obtaining the position of the objective aperture comprises:

binarizing the image of the objective aperture by using a set threshold to acquire a binarized image;

obtaining an area of an aperture hole of the objective aperture from the binarized image;

determining whether the area is within a predetermined range;

changing the threshold when a determination is made that the area is not within the predetermined range; and obtaining the position of the objective aperture, based on the binarized image when a determination is made that the area is within the predetermined range.

* * * * *